(12) United States Patent
Pucher (10) Patent No.: US 10,581,187 B2
(45) Date of Patent: Mar. 3, 2020

(54) PLUG RECEIVER WITH CONTACT SPRINGS FOR A CIRCUIT BOARD

(71) Applicant: Continental Automotive GmbH, Hannover (DE)

(72) Inventor: Björn Pucher, Regensburg (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 16/089,998

(22) PCT Filed: Mar. 22, 2017

(86) PCT No.: PCT/EP2017/056830
§ 371 (c)(1),
(2) Date: Sep. 28, 2018

(87) PCT Pub. No.: WO2017/167619
PCT Pub. Date: Oct. 5, 2017

(65) Prior Publication Data
US 2019/0123464 A1 Apr. 25, 2019

(30) Foreign Application Priority Data
Apr. 1, 2016 (DE) .................. 10 2016 205 476

(51) Int. Cl.
*H01R 12/87* (2011.01)
*H01R 12/72* (2011.01)
(Continued)

(52) U.S. Cl.
CPC ......... *H01R 12/721* (2013.01); *H01R 12/714* (2013.01); *H01R 12/87* (2013.01);
(Continued)

(58) Field of Classification Search
CPC .. H01R 12/721; H01R 12/91; H01R 13/7033; H01R 12/714; H01R 12/87; H01R 13/2421
See application file for complete search history.

(56) References Cited

U.S. PATENT DOCUMENTS 3,848,223 A    11/1974   Pechard .................. 439/637
3,980,376 A *   9/1976   Rosen ................ H01R 12/87
                                         439/327
(Continued)

FOREIGN PATENT DOCUMENTS

CN      103378487 A    10/2013  ........... H01R 13/639
DE        2316583 A1    10/1973  ............. H01R 12/72
(Continued)

OTHER PUBLICATIONS

German Office Action, Application No. 10 2016 205 476.7, 6 pages, dated Feb. 21, 2017.
(Continued)

*Primary Examiner* — Truc T Nguyen
(74) *Attorney, Agent, or Firm* — Slayden Grubert Beard PLLC (57) ABSTRACT

Various embodiments include a plug receptacle for an electrical plug-in connection for receiving a plug with electrical plug conductor comprising a contact region for electrical connection to the plug receptacle comprising: a housing with an insertion region into which the plug can be releasably inserted; an electrical plug receptacle conductor rigidly arranged in the housing; and an electrical connecting conductor floating in the housing configured to electrically connect the plug receptacle conductor to the plug conductor. The electrical connecting conductor exerts a connecting force onto the contact region of the plug conductor once
(Continued)

inserted into the plug receptacle. The connecting force runs substantially orthogonally in relation to said contact region.

10 Claims, 6 Drawing Sheets

(51) Int. Cl.
*H01R 12/71* (2011.01)
*H01R 12/91* (2011.01)
*H01R 13/24* (2006.01)
*H01R 13/703* (2006.01)

(52) U.S. Cl.
CPC ......... *H01R 12/91* (2013.01); *H01R 13/2421* (2013.01); *H01R 13/7033* (2013.01)

(56) References Cited

U.S. PATENT DOCUMENTS

| | | | | |
|---|---|---|---|---|
| 4,637,677 A * | 1/1987 | Barkus | ..................... | H01R 4/52 439/724 |
| RE32,559 E | 12/1987 | Fedder et al. | ................ | 439/325 |
| 4,749,357 A * | 6/1988 | Foley | ................ | H01R 12/7088 439/65 |
| 5,046,972 A * | 9/1991 | Pass | ..................... | H01R 13/193 439/249 |
| 5,240,420 A * | 8/1993 | Roberts | ................ | H01R 12/714 439/493 |
| 5,240,430 A * | 8/1993 | Soes | ..................... | H01R 12/592 439/260 |
| 5,454,730 A * | 10/1995 | Tozuka | ................ | H01R 4/4818 439/438 |
| 5,591,039 A * | 1/1997 | Matthews | ............. | H01R 13/53 439/181 |
| 6,004,168 A | 12/1999 | Fuchs et al. | .................. | 439/835 |
| 6,234,851 B1 * | 5/2001 | Phillips | ................ | H01R 4/4863 439/819 |
| 6,644,995 B1 | 11/2003 | Jones et al. | ................... | 439/260 |
| 7,918,692 B1 * | 4/2011 | Hertzler | ............... | H01R 9/2408 439/712 |
| 8,851,918 B2 | 10/2014 | Yoshisuji et al. | ............. | 439/350 |
| 8,968,020 B2 | 3/2015 | Nishiyama | ..................... | 439/345 |
| 2003/0232533 A1 * | 12/2003 | Burmeister | .......... | H01R 12/721 439/259 |
| 2004/0005816 A1 | 1/2004 | Sato et al. | ..................... | 439/439 |
| 2005/0208811 A1 | 9/2005 | Okamoto et al. | ............. | 439/260 |
| 2006/0019520 A1 * | 1/2006 | Kawase | ............. | H01R 13/6315 439/247 |
| 2009/0004889 A1 * | 1/2009 | Sakamoto | ............ | H01R 13/629 439/59 |
| 2010/0167570 A1 | 7/2010 | Yang et al. | ................... | 439/325 |
| 2012/0295481 A1 * | 11/2012 | Zhang | ................. | G06K 7/0021 439/607.22 |
| 2013/0012071 A1 * | 1/2013 | Nakazura | ............... | H01R 12/79 439/630 |
| 2013/0017702 A1 | 1/2013 | Kamiya et al. | ................ | 439/345 |

FOREIGN PATENT DOCUMENTS

| | | | | |
|---|---|---|---|---|
| DE | 19753076 C1 | 8/1999 | ............ | H01R 12/55 |
| DE | 60306271 T2 | 10/2006 | ............ | H01R 12/16 |
| DE | 102012202573 A1 | 1/2013 | ............ | H01R 12/51 |
| DE | 102012009509 A1 | 11/2013 | ............ | H01R 12/72 |
| JP | 01158680 U | 11/1989 | ........... | H01R 13/639 |
| JP | 03100383 U | 10/1991 | ............ | H01R 24/00 |
| JP | 07282921 A | 10/1995 | .......... | H01R 13/639 |
| JP | H08236200 A | 9/1996 | .......... | H01R 13/629 |
| JP | 2010153209 A | 7/2010 | ............ | H01R 12/77 |
| WO | 2017/167619 A1 | 10/2017 | ............ | H01R 12/72 |

OTHER PUBLICATIONS

International Search Report and Written Opinion, Application No. PCT/EP2017/056830, 28 pages, dated Jun. 21, 2017.
Chinese Office Action, Application No. 201780020074.3, 20 pages, dated Jul. 25, 2019.
Japanese Office Action, Application No. 2018551448, 7 pages, dated Oct. 29, 2019.

* cited by examiner

PLUG RECEIVER WITH CONTACT SPRINGS FOR A CIRCUIT BOARD

CROSS-REFERENCE TO RELATED APPLICATIONS

This application is a U.S. National Stage Application of International Application No. PCT/EP2017/056830 filed Mar. 22, 2017, which designates the United States of America, and claims priority to DE Application No. 10 2016 205 476.7 filed Apr. 1, 2016, the contents of which are hereby incorporated by reference in their entirety.

TECHNICAL FIELD

The present disclosure relates to connectors for electrical components. Various embodiments may include a plug receptacle and/or a plug for an electrical plug-in connection, an electrical plug-in connection, a plug receptacle, and/or a plug for an electrical plug-in connection which can be releasably connected to one another.

BACKGROUND

Plug-in connections are usually used for making contact with printed circuit boards with which electrical signals can be transmitted and/or a power supply can be ensured. In this case, the printed circuit boards can have any desired number of electrical poles. For example, printed circuit boards with a direct plug-in connector, such as the type 35 plug receptacle from Lumberg for example, are known. Changes in temperature of the plug-in connections which occur can lead to relative movements between the metal conductor in the plug and the metal contact face on the printed circuit board. These relative movements are predominantly the result of the different thermal expansion behavior of the materials used and can cause frictional corrosion which can unnecessarily increase the electrical resistance of the contact-connection. Furthermore, reliable electrical contact between the plug receptacle and the plug can then no longer be ensured.

It also known to use contact-connections from printed circuit boards to plug-in connections when stringent requirements are made in respect of resistance to thermal cycling by means of an indirect connection. In this case, additional contact pins are fastened on the printed circuit board, for example by soldering connections which are usually arranged and fixed in a frame element. The plug can be plugged onto these additional contact pins, wherein, in this case, the coefficients of thermal expansion of the force-transmitting components and the flexibility of the contact pins can sufficiently reduce the undesired relative movements in the electrical contact areas.

SUMMARY

Therefore, teachings of the present invention may be embodied in a plug receptacle and a plug for an electrical plug-in connection, which plug receptacle and plug exhibit improved resistance to thermal cycling and can permanently ensure an electrical connection. For example, some embodiments may include a plug receptacle (100) for an electrical plug-in connection (10) for connection to a plug (200) which has at least one electrical plug conductor (202, 204), wherein the at least one plug conductor (202, 204) comprises a contact region (203, 205) for electrical connection to the plug receptacle (100), wherein the plug receptacle (100) has: a housing (110) which has an insertion region (113) into which the plug (200) can be releasably inserted, at least one electrical plug receptacle conductor (102) which is rigidly arranged in the housing (110), and an electrical connecting conductor (140) which is arranged in a floating manner in the housing (110) and which is designed to electrically connect the at least one plug receptacle conductor (102) to the at least one plug conductor (202, 204) and to exert a connecting force onto the contact region (203, 205) of the at least one plug conductor (202, 204), which connecting force runs substantially orthogonally in relation to said contact region, when the plug (200) is inserted into the insertion region (113).

In some embodiments, there is a locking element which is arranged in a linearly movable manner in the housing (110) and which interacts with the connecting conductor and can be moved along a linear movement path between a locking position, in which the plug (200) can be fixedly connected to the plug receptacle (100), and an unlocking position in which the plug (200) can be released from the plug receptacle (100).

In some embodiments, the linear movement path of the locking element runs substantially orthogonally in relation to the plug conductor (202, 204).

In some embodiments, there is a shaft (120) which is arranged in a rotatable manner in the housing (110) and on which a lever (130) is rigidly arranged, wherein the lever (130) interacts with the connecting conductor (140) and can be moved between a locking position, in which the plug (200) can be fixedly connected to the plug receptacle (100), and an unlocking position in which the plug (200) can be released from the plug receptacle (100).

In some embodiments, the electrical connecting conductor is an electrically conductive helical spring (140).

In some embodiments, the lever (130) has a passage opening (132), through which the electrical connecting conductor (140) at least partially extends, and a stop face (134), which at least partially surrounds one end of the passage opening (132), the helical spring (140) has a first region (142) with a first diameter (D1) and a second region (144) with a second diameter (D2) which is smaller than the first diameter (D1), and wherein one end of the first region (142), which is connected to the second region (144), is designed to make contact with the stop face (134) when the lever (130) is in the locking position.

In some embodiments, the lever (130) has a first locking section (136) which is designed to engage with a second locking section (220), which is arranged on the plug (200), when the plug (200) is arranged in the insertion region (113) and the lever (130) is in the locking position.

In some embodiments, the first locking section is a projection (136) which is provided on the lever (130), and the second locking section is a recess (220) which is provided on the plug (200) and into which the projection (136) can at least partially project when the plug (200) is arranged in the insertion region (113) and the lever (130) is in the locking position.

In some embodiments, the housing (110) is formed from a first housing element (112) and a second housing element (114) which is arranged such that it can move relative to the first housing element (112) and which can move between a release position and a blocking position, and the first housing element (112) has the insertion region (113), and the second housing element (114) is designed to prevent, in the blocking position, release of the plug (200) from the insertion region (113), and to allow, in the release position, release of the plug (200) from the insertion region (113).

As another example, some embodiments include a plug (200) for an electrical plug-in connection (10) for connection to a plug receptacle (100) which has at least one electrical plug receptacle conductor (102), in particular a plug receptacle (100) as claimed in one of the preceding claims which has a first locking section (136), comprising: a substantially plate-like body (210) which is designed to be moved between an unplugged position, in which the plate-like body (210) is detached from the plug receptacle (100), and an inserted position, in which the plate-like body (210) is inserted into the plug receptacle (100) and electrically connected to the plug receptacle conductor (102), at least one electrical plug conductor (202, 204) which is attached to a surface of the plate-like body (210) and has at least one contact region (203, 205), and at least one second locking section (220) which is provided on the plate-like body (210) and is designed to engage with the first locking section (136) when the plate-like body (210) is in the inserted position.

In some embodiments, the at least one second locking region is a recess (220) which is provided in the plate-like body (210) and is designed to at least partially receive the first locking section which is designed in the form of a projection (136).

In some embodiments, there is at least one positioning device (230) which is provided on the plate-like body (210) and is designed to position the plug (200) relative to the plug receptacle (100).

As another example, some embodiments may include a plug-in connection (10), comprising: a plug receptacle (100) as described above, and a plug (200) as described above, wherein the plug (200) can be releasably connected to the plug receptacle (100).

BRIEF DESCRIPTION OF THE DRAWINGS

Further features and objects of teachings of the present disclosure are described herein, taking into consideration the appended drawings, in which.

DETAILED DESCRIPTION

The teachings of the present disclosure include a system which structurally diverts the forces caused by thermal changes in geometry in such a way that the forces at the electrical contact point, which could overcome the static friction at this point, act substantially orthogonally in relation to the contact area. As a result, a thermally-induced relative movement between the electrical contacts, for example between the plug receptacle conductor and the plug conductor, can be avoided, and this can lead to a reduction in the frictional corrosion at the electrical contact points.

Some embodiments include a plug receptacle for an electrical plug-in connection for connection to a plug which has at least one electrical plug conductor. The at least one plug conductor comprises a contact region for electrical connection to the plug receptacle. The plug receptacle has a housing in which an insertion region is provided, it being possible for the plug to be releasably inserted into said insertion region, at least one electrical plug receptacle conductor which is rigidly arranged in the housing, and an electrical connecting conductor which is arranged in a floating manner in the housing and which is designed to electrically connect the at least one plug receptacle conductor to the at least one plug conductor and to exert a connecting force onto the contact region of the plug, which connecting force runs substantially orthogonally in relation to said contact region, when the plug is inserted into the insertion region. The connecting force which runs substantially orthogonally in relation to the contact region can further at least partially establish a force-fitting connection between the connecting conductor and the plug conductor.

In some embodiments, a floating arrangement of the connecting conductor describes an arrangement in which the connecting conductor is not permanently and fixedly attached to any other element of the plug-in connection and consequently is located substantially loosely in the housing. For example, the connecting conductor, which is in the form of a helical spring, can be prestressed in a direction orthogonal in relation to the insertion direction, but has a certain degree of free play along other directions which run orthogonally in relation to said direction. This play allows the connecting conductor to move together with the inserted plug when vibrations occur for example, so that frictional corrosion which occurs in the electrical contact regions can be prevented.

In some embodiments, the plug receptacle has a locking element which is arranged in a linearly movable manner in the housing and which interacts with the connecting conductor and can be moved along a linear movement path between a locking position, in which the plug can be fixedly connected to the plug receptacle, and an unlocking position in which the plug can be released from the plug receptacle. In a preferred refinement of this kind, it is advantageous when the linear movement path of the locking element runs substantially orthogonally in relation to the plug conductor.

In some embodiments, the plug receptacle has a shaft which is arranged in the housing and has a lever which is arranged on it in a rigid manner and interacts with the connecting conductor and can be moved between a locking position, in which the plug can be fixedly connected to the plug receptacle, and an unlocking position in which the plug can be released from the plug receptacle. In some embodiments, the rotatable shaft with the lever which is attached to it in a rigid manner constitutes a locking apparatus for the plug when said plug is inserted into the insertion region of the housing. Therefore, rotational locking is provided as a result.

In some embodiments, the electrical connecting conductor is an electrically conductive helical spring. The necessary connecting force for an at least partially force-fitting connection between the connecting conductor and the plug conductor can be generated by the spring force of the helical spring. In some embodiments, the helical spring is arranged in the housing in a floating manner between the plug receptacle conductor and the plug conductor in such a way that said helical spring is at least partially prestressed in the installed state and can therefore exert the connecting force, which runs substantially orthogonally, onto the contact region of the plug. Furthermore, the floating arrangement or bearing of the connecting conductor can at least partially ensure that changes in thermal expansion can be compensated for by elastic deformation of the connecting conductor, without causing a relative movement at the contact points to the plug conductor and/or plug receptacle conductor. Frictional corrosion in the contact region between the connecting conductor and the plug conductor can be reduced and even sometimes avoided in this way.

In some embodiments, the lever has a passage opening, through which the electrical connecting conductor at least partially extends, and a stop face, which at least partially surrounds one end of the passage opening. In some embodiments, the helical spring further has a first region with a first diameter and a second region with a second diameter which is smaller than the first diameter. In this case, one end of the first region, which is connected to the second region, is designed to make contact with the stop face when the lever is in the locking position, and the second region may extend through the passage opening of the lever. In this way, the interaction between the lever and the connecting conductor is implemented in the form of the helical spring. In some embodiments, the helical spring can be at least partially compressed, and therefore detached from the plug connector, by rotating the lever. On account of the prestress, the first region of the connecting conductor is designed to at least partially push and prestress the lever into the locking position by the prestressing force of the first region acting on the stop face.

In some embodiments, the lever has a first locking section which is designed to releasably engage with a second locking section, which is arranged on the plug, when the lever is in the locking position. The first locking section may include a projection which is provided on the lever and is designed to at least partially project into the second locking section, which is designed in the form of a recess, when the plug is inserted in the insertion region and the lever is in the locking position. Owing to the projection projecting into the recess, the plug can be fixedly connected to the plug receptacle, as a result of which it is possible to ensure that the plug is not unintentionally released from the plug receptacle.

In some embodiments, the housing is formed from a first housing element and a second housing element which is arranged such that it can move relative to the first housing element and which can move between a blocking position and a release position. The first housing element has the insertion region and is designed to at least partially receive the plug. The second housing element is designed, in the blocking position, to block the ability of the shaft with the lever which is in the locking position to rotate and therefore to prevent the possibility of the first locking section of the lever being released from the second locking section of the plug when the plug is inserted into the plug receptacle. In the release position, the second housing element is designed to enable the ability of the shaft with the lever to rotate, so that it is possible to release the plug from the plug receptacle.

In some embodiments, after insertion of the plug into the plug receptacle, the second housing element can be moved relative to the first housing element, preferably along a linear movement path, so that the ability of the shaft to rotate is blocked and therefore a secure and permanent connection can be established between the plug and the plug receptacle.

Some embodiments include a plug receptacle which has at least one electrical plug receptacle conductor. The plug receptacle has a lever which is arranged on a rotatable shaft and has a first locking section. In some embodiments, the plug comprises a substantially plate-like body which is designed to be moved between an unplugged position, in which the plate-like body is detached from the plug receptacle, and an inserted position, in which the plate-like body is inserted in the plug receptacle and electrically connected to the plug receptacle conductor. The plug further comprises at least one second locking section which is provided on the plate-like body and is designed to engage with the first locking section when the plate-like body is in the inserted position.

In some embodiments, the at least one second locking section includes a recess which is provided in the plate-like body and is designed to at least partially receive the first locking section, which is designed in the form of a projection on the lever, and therefore to prevent the plug being released from the plug receptacle.

In some embodiments, the plug has at least one positioning device which is formed in the plate-like body and is designed to position the plug relative to the plug receptacle. For example, the positioning device is formed in the form of recesses which at least partially receive projections, which are provided on the plug receptacle, during an insertion process of the plug into the plug receptacle, and therefore can realize the relative position between the plug and the plug receptacle.

Figure 1:
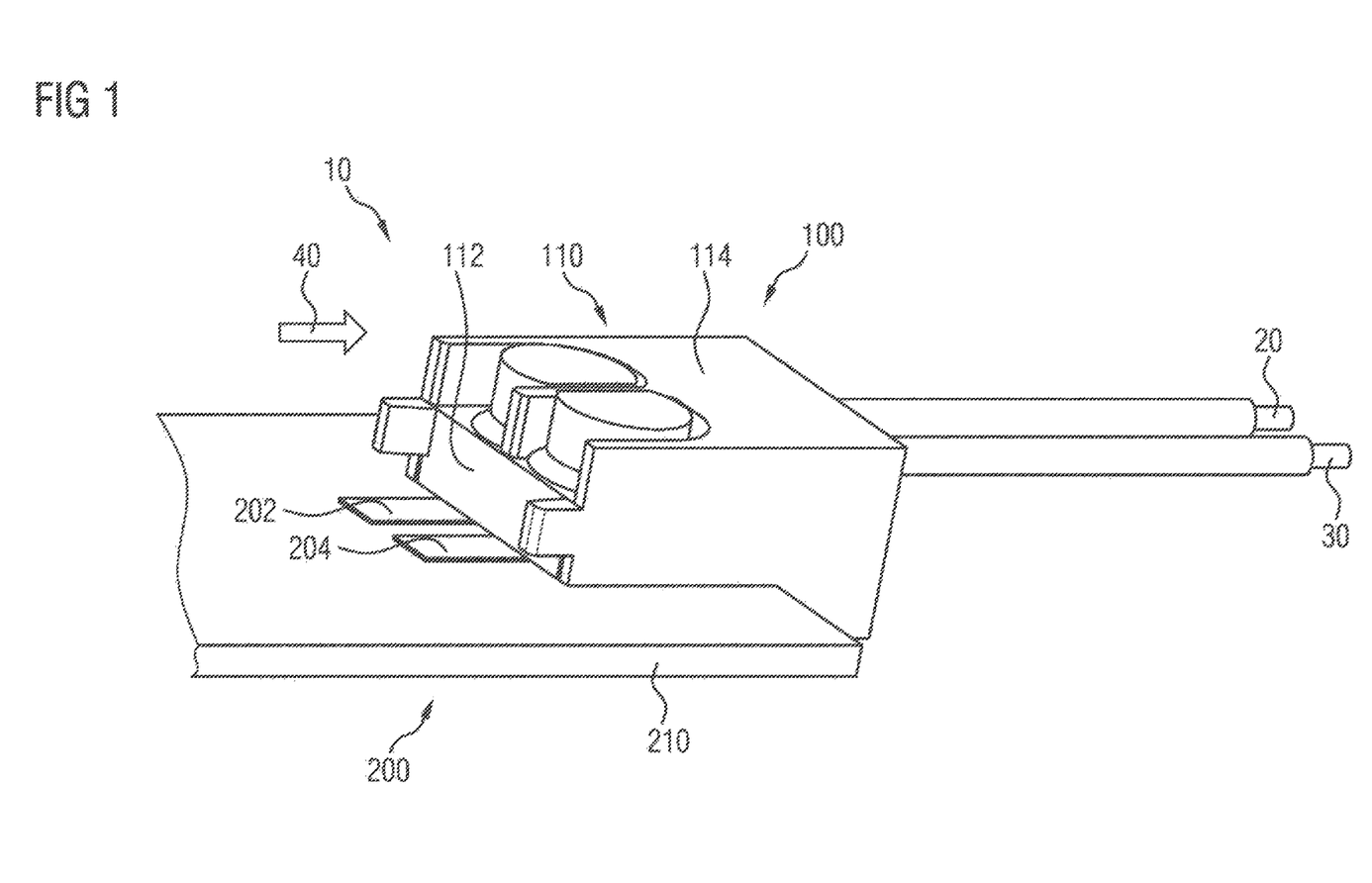
FIG. 1 illustrates a perspective view of a plug-in connection incorporating teachings of the present disclosure.

FIG. 1 illustrates an electrical plug-in connection 10 incorporating teachings of the present disclosure. The plug-in connection 10 has a plug receptacle 100 and a plug 200 which can be releasably connected to the plug receptacle 100. FIG. 1 further illustrates, by way of example, connection lines 20, 30 which are connected to the plug receptacle 100 and which are designed to transmit signals and/or to conduct electric current. In particular, the connection lines 20, 30 are electrically connected to at least one plug receptacle conductor 102 (see FIG. 3).

The plug 200 has a plate-like body 210 on which a first plug conductor 202 and a second plug conductor 204 are arranged in the example shown in FIG. 1. The plate-like body 210 can be, for example, a printed circuit board in which the electrical plug conductors 202, 204 are printed on in an arbitrary form. In particular, the first and second plug conductors 202, 204 are conductor tracks which are printed onto the printed circuit board 210. The plug 200 can also have further electrical components, not explicitly illustrated, such as, for example, coils, capacitors, relays, diodes and/or further known electrical components.

In some embodiments, the plug 200 is arranged fixed in position and the plug receptacle 100 is moved relative to the plug 200 in such a way that the plate-like body 210 is received in the plug receptacle 100. In some embodiments, the plug receptacle 100 is arranged fixed in position and the plug 200 is moved in such a way that it is inserted into the plug receptacle 100. In some embodiments, both the plug receptacle 100 and the plug 200 are arranged in a movable manner, that is to say not fixed in position, and can be moved in relation to one another in such a way that the plug 200 is inserted into the plug receptacle 100.

The first plug conductor 202 has a first contact region 203, and the second plug conductor 204 has a second contact region 205. The first and the second contact region 203, 205 are each designed to come into electrically conductive contact with a connecting conductor 140, which is arranged in the housing 110 of the plug receptacle 100, (see FIG. 3) when the plug 200 is fully inserted into the plug receptacle 100.

The plug 200 can be inserted into the plug receptacle 100 along an insertion direction 40 (see the arrow in FIG. 1), as a result of which an electrical connection can be established between the connection lines 20, 30 and the plug conductors 202, 204. By way of example, the plug 200 is an integral constituent part of directly overmolded or cast printed circuit boards which serve to electronically control sensors and actuators and with which electrical contact has to be made in the event of increased requirements in respect of thermal cycling. By way of example, the plug is a printed circuit board, which is populated by LEDs, in vehicle lighting units.

The plug receptacle 100 has a housing 110 which is formed from a first housing element 112 and a second housing element 114. In this case, the second housing element 114 can move relative to the first housing element 112 between a release position (see FIG. 7B for example) and a blocking position (see FIG. 8B for example).

Figure 2:
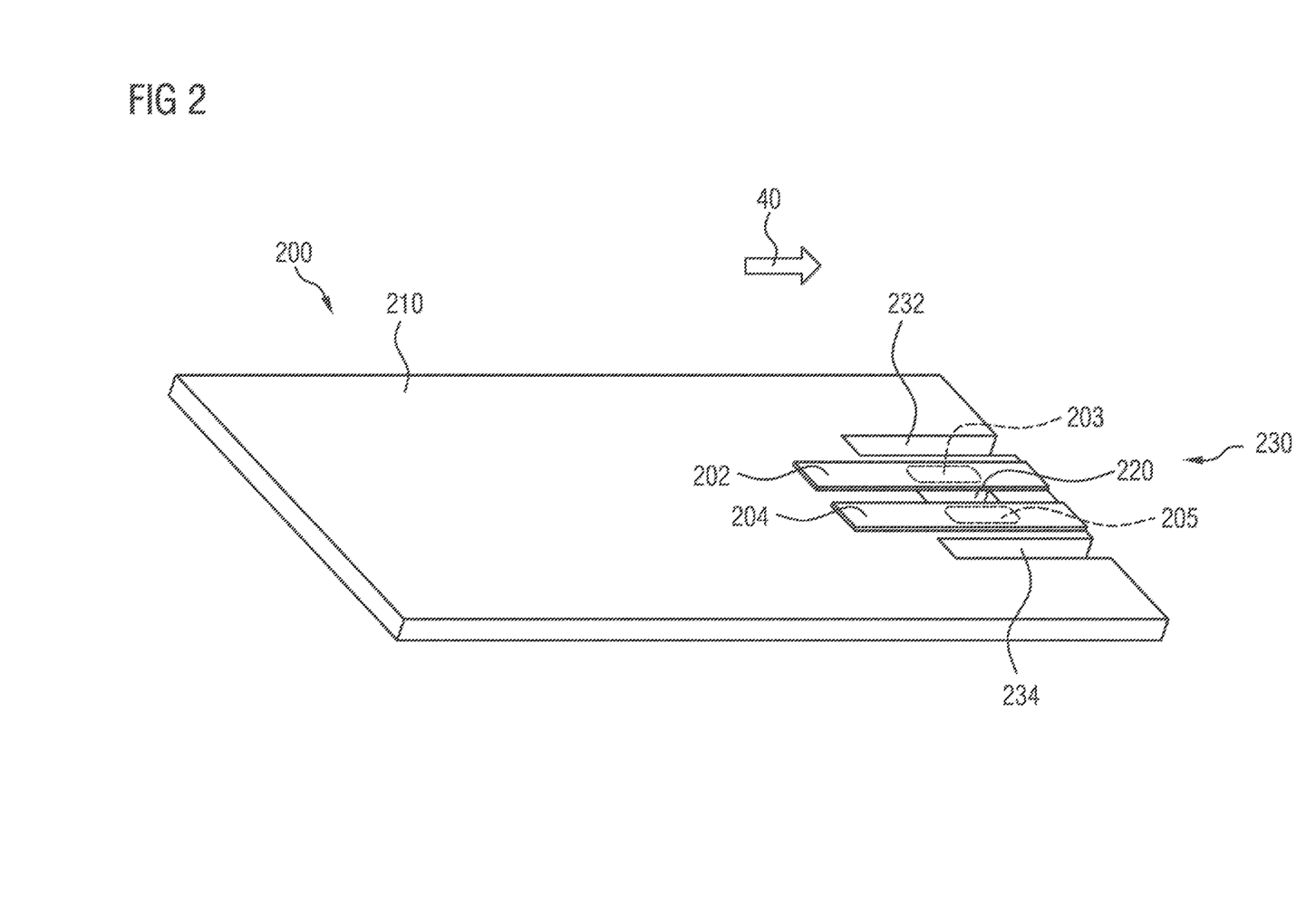
FIG. 2 shows a perspective view of a plug incorporating teachings of the present disclosure.

A plug 200 incorporating teachings of the present disclosure is illustrated by the plate-like body 210 with additional reference to FIG. 2, the first connecting conductor 202 and the second connecting conductor 204 being mounted onto said plate-like body. FIG. 2 further shows that the plug 200 has a locking section 220 which is provided on the plate-like body 210 and, in the example illustrated in the drawings, is formed in the form of a recess which is located between the first connecting plug conductor 202 and the second plug conductor 204. The locking section 220 is designed to engage with a locking section 136, which is provided on the plug receptacle 100, (see FIG. 3 for example) when the plug 200 is inserted into the plug receptacle 100, this being described in greater detail below.

In some embodiments, the plug 200 has a positioning device 230 which, in the example illustrated in the drawings, is formed from a first slot 232 and a second slot 234. The positioning device 230 is designed to receive corresponding projections or ribs (not explicitly illustrated in the drawings) which are provided on the housing 110. When the plug 200 is inserted into the plug receptacle 100, the positioning device 230 is designed to perform relative positioning of the plug 200 relative to the plug receptacle 100 and to ensure that the plug 200 is properly connected to the plug receptacle 100.

Figure 3:
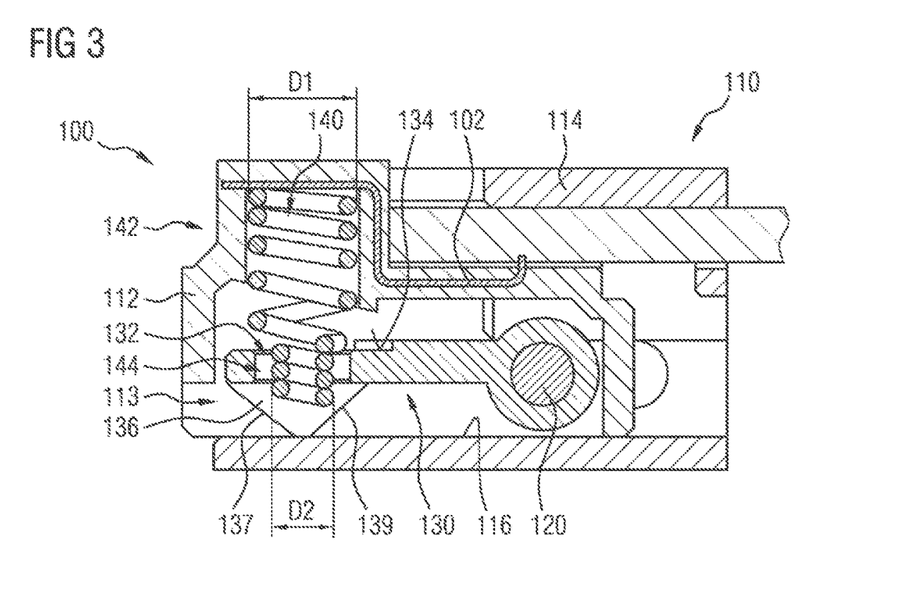
FIG. 3 illustrates a sectional view of a plug receptacle incorporating teachings of the present disclosure.

FIG. 3 shows a sectional view of the plug receptacle 100, which sectional view is substantially parallel in relation to the insertion direction 40 and in which a plug 200 is not yet inserted. Furthermore, an electrical plug receptacle conductor 102 is rigidly arranged in the housing 100 and is designed to establish an electrical connection to the connection conductors 20, 30. By way of example, the plug receptacle conductor 102 is a punched contact which is embedded in the first housing element 112.

Furthermore, a shaft 120 is rotatably arranged in the housing 110, in particular in the first housing element 112, a lever 130 being rigidly attached to said shaft. In particular, the lever 130 extends antiparallel in relation to the insertion direction 40. The lever 130 can be moved between a locking position (see FIG. 3), in which the plug 200 can be fixedly connected to the plug receptacle 100, and an unlocking position (see FIG. 4), in which the plug 200 can be released from the plug receptacle 100. Therefore, rotational locking can be provided by the lever 130.

In some embodiments, a locking element can move in a linear manner in the housing instead of the lever 130. The principle of locking by means of a locking element of this kind is based substantially on a linear movement path of the locking element in the housing. Therefore, translatory locking can be provided. In this case, the locking element may move orthogonally in relation to the plug conductor 202, 204.

In some embodiments, the first housing element 112 has an insertion region 113 into which the plug 200 can be inserted along the insertion direction 40. The insertion region 113 has a shape which substantially corresponds to the shape of the plug 200, so that the plug 200 can be positioned in the insertion region 113.

The plug receptacle 100 further has an electrical connecting conductor 140 which is arranged in a floating manner in the first housing element 112 and interacts with the lever 130. In the embodiment illustrated in the drawings, the electrical connecting conductor is designed in the form of an electrically conductive and elastic helical spring 140 and is arranged within the first housing element 112.

A floating arrangement of the connecting conductor 140 describes an arrangement in which the connecting conductor 140 is not fixedly attached to any other element of the plug-in connection 10 and consequently is located substantially loosely in the housing. By way of example, the connecting conductor which is in the form of a helical spring 140 is prestressed orthogonally in relation to the insertion direction 40 in one direction (in the direction from top to bottom in FIG. 3) (that is to say the connecting conductor 140 bears against the plug receptacle conductor 102 and against the lever 130), but has a certain degree of free play along directions which run orthogonally in relation to said direction. This play allows the helical spring 140 to move together with the inserted plug 200 when vibrations occur for example, so that frictional corrosion which occurs in the contact regions 203, 205 can be prevented.

According to FIG. 3, the connecting conductor 140 is arranged in a floating manner in the housing 110 in such a way that one end of the electrical connecting conductor 140 is permanently in electrical contact with the plug receptacle conductor 102. By way of example, the connecting conductor 140 is at least partially prestressed, so that one end of the electrical connecting conductor 140 is permanently in electrical contact with the plug receptacle conductor 102. Therefore, current can flow and/or signals can be transmitted between the plug receptacle conductor 102 and the connecting conductor 140.

The connecting conductor 140, which is in the form of a helical spring, has a first region 142 with a first diameter D1 and a second region 142 with a second diameter D2 which is smaller than the first diameter D1. The first region 142 merges, preferably so as to permit flow, with the second region 144. The first region 142 is in contact with the plug receptacle conductor 102.

A passage opening 132 is formed in the lever 130, the second region 144 of the electrical connecting conductor 140 extending through said passage opening. Furthermore, one end of the passage opening 132 (the upper end of the passage opening 132 in the exemplary embodiment illustrated in the drawings) is at least partially surrounded by a stop face 134 which is designed to come into partial contact with the lower end of the first region 142 of the electrical connecting conductor 140. In particular, the first region 142 is arranged in a floating manner between the plug receptacle conductor 102 and the lever 130 and is at least partially prestressed, so that the first region 142 of the helical spring 140 at least partially pushes the lever 130 into the locking position and the lever 130, more precisely a locking section 136 which is formed on said lever, bears against the floor 116 of the housing.

In some embodiments, the lever 130 comprises the locking section 136 which is designed, for example, in the form of a projection which projects downward. According to FIG. 3, the locking section 136 is substantially triangular and has a first edge 137 and a second edge 139. The first edge 137 is designed, during an insertion process of the plug 200 into the insertion region 113, to come into contact with a front end of the plug 200, in particular of the plate-like body 210, and to be pushed upward, as a result of which the lever 130, including the shaft 120, rotates (see FIG. 4). The second edge 139 is designed, during an unplugging process of the plug 200 from the insertion region 113, to come into contact with a front edge of the second locking region 220 and to be pushed upward, as a result of which the lever 130, including the shaft 120, rotates.

Figure 4:
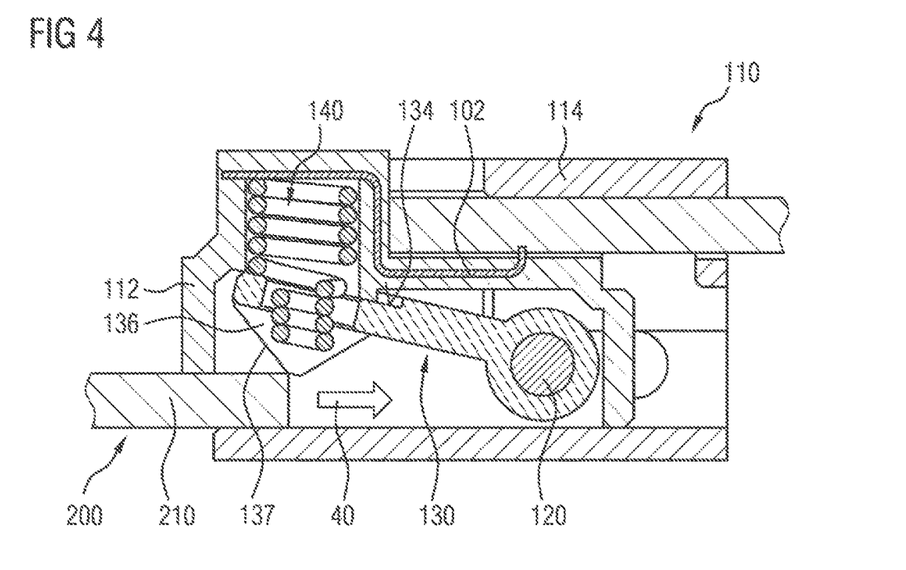
FIG. 4 illustrates the sectional view of FIG. 3, in which a plug according to the invention is moved from the unplugged position to the inserted position.

A situation in which insertion of a plug 200 (see FIG. 2) into the plug receptacle 100 is beginning is shown with additional reference to FIG. 4. At this point in time, the electrical connecting conductor 140 is in the position shown in FIG. 3, so that the first region 142 of the electrical connecting conductor 140 bears against the stop face 134 of the lever 130.

If, according to FIG. 4, the plug 200 is now pushed in, a front end of the plug 200 initially comes into contact with the downwardly sloping first edge 137 of the locking section 136 and pushes the lever 130 upward. This causes rotation of the shaft 120. In the position shown in FIG. 4, the lever 130 is in its unlocking position in which it is possible to push the plug 200 further in.

Owing to the rotational movement of the shaft 120, the helical spring 140 is further compressed and at least partially moved away from the floor 116 of the housing. As a result, the size of the insertion region 136 is increased and the plug 200 can be inserted further. During the insertion process of the plug 200 into the plug receptacle 100, the connecting conductor 140 remains permanently in electrical contact with the plug receptacle conductor 102.

If the plug 200 is moved further along the insertion direction 40, the first locking section 136 engages with the second locking section 220 at a specific point in time, in particular when the plug 200 is in the inserted position. According to the embodiments illustrated in the figures, the projection 136 then projects into the recess 220. On account of the prestressing force which is applied to the lever 130 by means of the helical spring 40 in FIG. 4, the lever 130 automatically returns to its locking position when the recess 220 is located directly beneath it (see FIG. 5).

Figure 5:
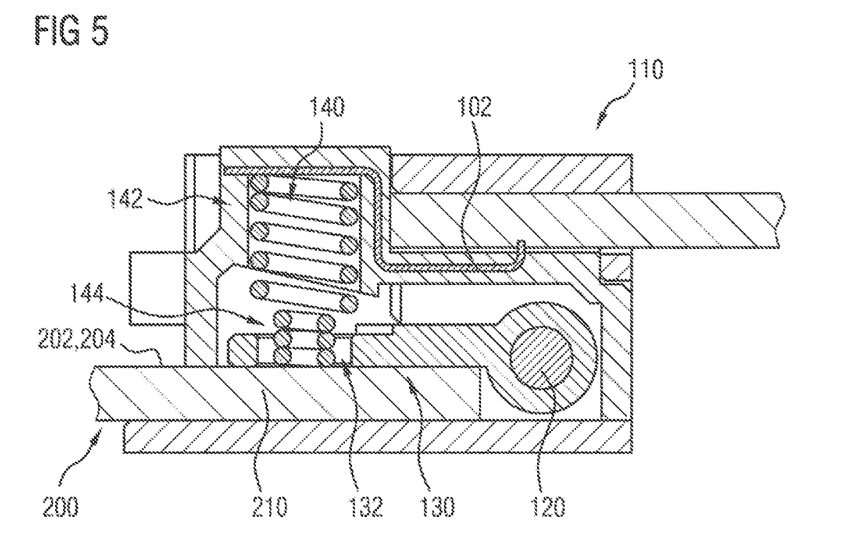
FIG. 5 shows the sectional view of FIG. 3, in which the plug according to the invention is in the fully inserted position.
Figure 6:
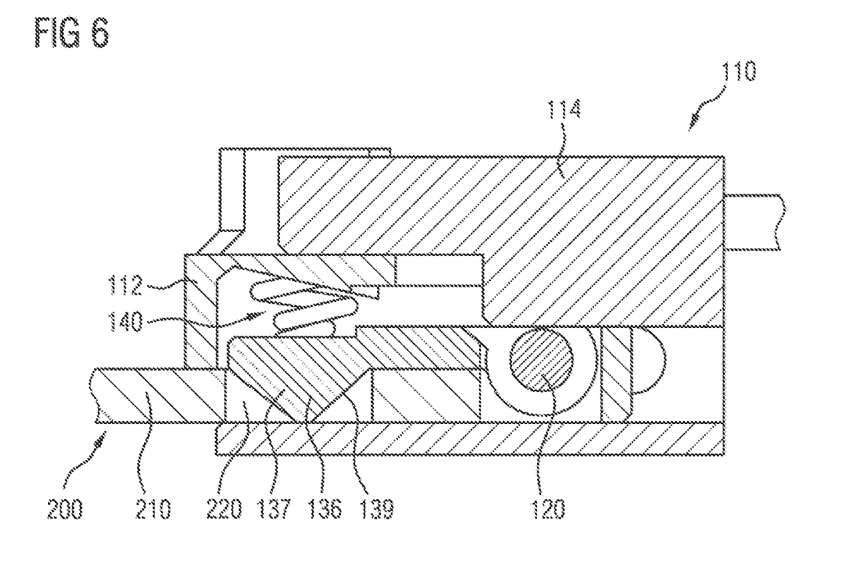
FIG. 6 shows a further sectional view of a plug receptacle according to the invention, in which a plug incorporating teachings of the present disclosure is in the inserted position.

In the position shown in FIG. 5, the plug 200 is in the fully inserted position in which the second region 144 of the connecting conductor 140 is in electrical contact with the respectively associated contact region 203, 205 of the respective plug conductor 202, 204. With additional reference to FIG. 6, which shows a section which is parallel and offset in relation to the sectional view of FIG. 5, in this position the lever 130 is in the locking position and the locking region 136 again bears against the floor 116 of the housing 110, as is also illustrated in FIG. 3.

Owing to the fact that the connecting conductor 140 is further at least partially compressed, it is ensured in FIG. 5 that electrical contact between the connecting conductor 140 and the plug conductor 202, 204 is ensured. On account of the preliminary compression of the helical spring 140, the respective contact region 203, 205 of the plug conductor 202, 204 has exerted on it a connecting force which runs substantially orthogonally in relation to said contact region (profile of the connecting force in FIG. 5 in the direction from top to bottom). This connecting force at least partially creates a frictional connection between the connecting conductor 140 and the respective plug conductor 202, 204.

FIGS. 3 to 6 likewise show that the connecting conductor 140 is arranged in an at least partially floating manner within the housing and is at least partially held in position only by the second region 144 which protrudes through the passage opening 132. The floating arrangement of the connecting conductor 140 within the housing 110 ensures at least partial compensation of any thermal expansions of the electrical elements, as a result of which frictional corrosion at the contact point between the connecting conductor 140 and the plug conductor 202, 204 can be at least partially avoided. Permanent and reliable electrical contact is also ensured by the connecting force of the helical spring 140.

Although only one connecting element 140 is illustrated in FIGS. 3 to 6, it goes without saying that the number of plug conductors 202, 204 can correspond to the number of connecting conductors 140. That is to say that the plug receptacle 100 illustrated by way of example in the drawings has a total of two connecting conductors 140 which are designed according to FIGS. 3 to 6 and can come into electrical contact with an associated plug conductor 202, 204.

Figure 7A:
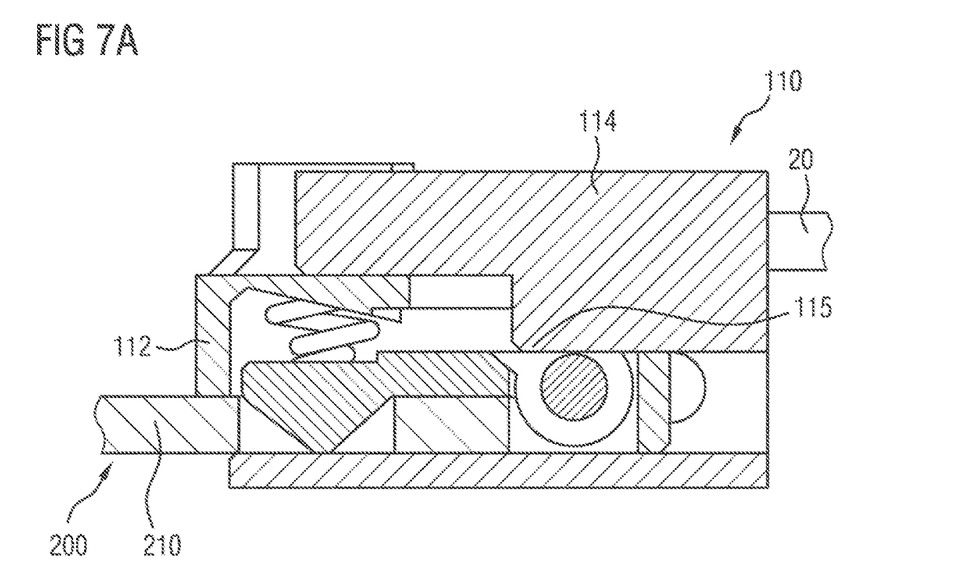
FIG. 7A illustrates a further sectional view of a plug-in connection incorporating teachings of the present disclosure in which the plug incorporating teachings of the present disclosure is in the inserted position and the housing element is in the release position.

FIGS. 7A, 7B, 8A, and 8B show different positions of the housing 110. FIG. 7A shows the second housing element 114 in the release position in which rotational movement of the shaft 120 is possible. In the release position of the second housing element 114, the lever 130 can accordingly be rotated, so that a plug 200 can actually be inserted into the plug receptacle 100. However, on account of vibrations for example, the plug 200 may be unintentionally released from the plug receptacle 100 since the vibration forces exceed the prestressing force of the connecting conductor 140 and consequently can cause movement of the lever 130, and the locking section 136 can then come loose from the locking section 220.

Figure 8A:
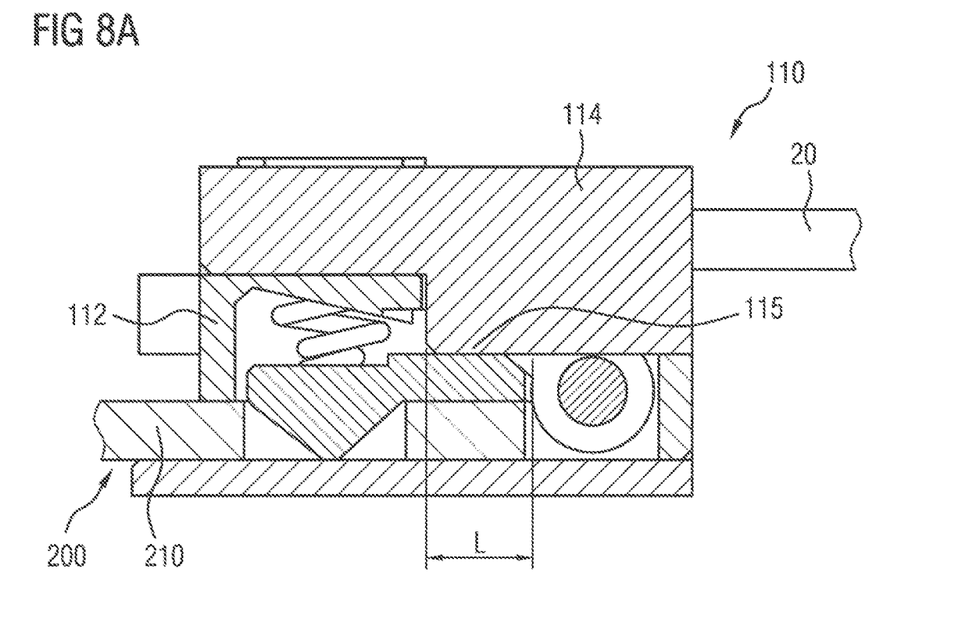
FIG. 8A illustrates the sectional view of FIG. 7A, in which the plug is in the inserted position and the housing element is in the blocking position.
Figure 8B:
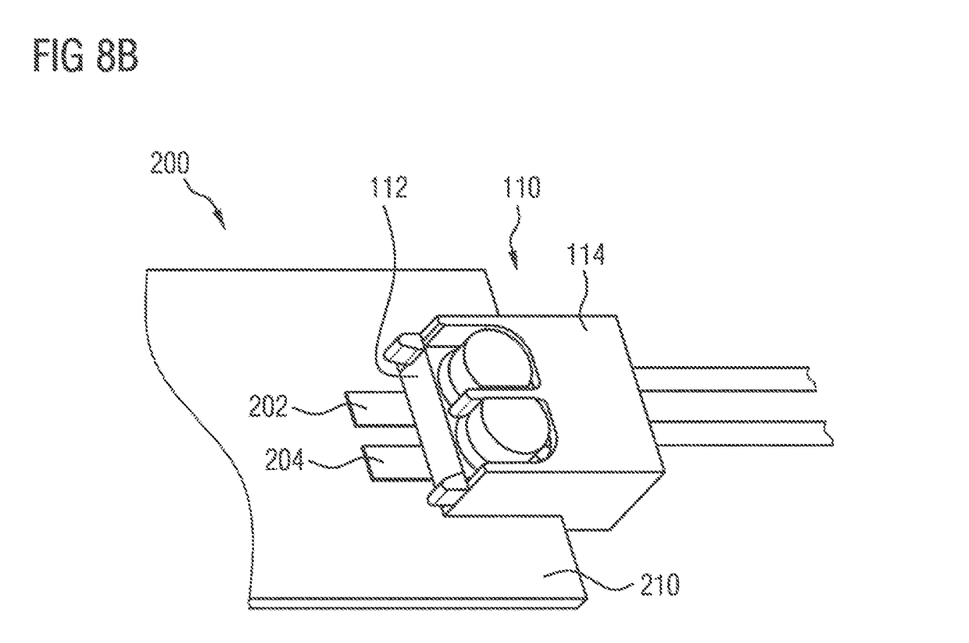
FIG. 8B illustrates a perspective view of the plug-in connection of FIG. 8A.

In order to avoid unintentional release of the plug-in connection 10, the second housing element 114 can be moved from the release position to a blocking position (see FIGS. 8A and 8B). In the process, the housing element 114 is moved substantially against the push-in direction 40 of the plug and blocks the rotational movement of the shaft 120 and of the lever 130.

FIG. 8A shows that the housing 114 is at least partially moved along the lever 130 and therefore blocks the rotational movement of the lever 130. A rotational movement of the shaft 120 is also blocked in this position and consequently the locking section 136 of the lever 130 cannot come loose from the locking section 220 of the plug 200 either, as a result of which permanent and reliable connection between the plug receptacle 100 and the plug 200 can be ensured.

In some embodiments, the movement of the second housing element 114 to the blocking position produces an overlap length L between a blocking section 115 of the housing element 114 and the lever 130, as a result of which the rotational movement of the lever 130 is mechanically blocked (see FIG. 8A).

Figure 7B:
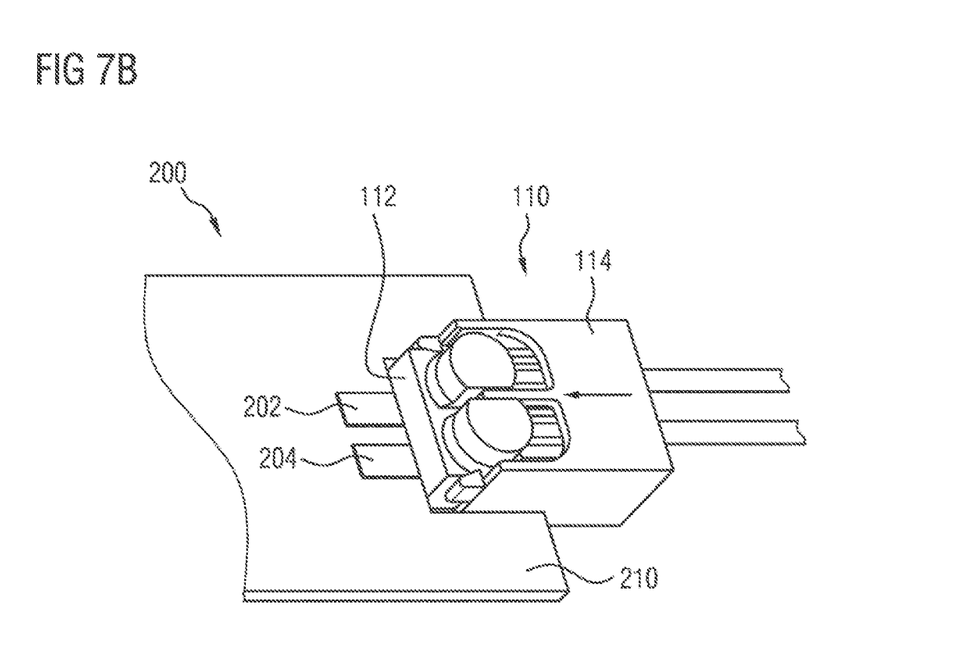
FIG. 7B shows a perspective view of the plug-in connection of FIG. 7A.

In order to release the plug 200 from the plug receptacle 100, the second housing element 114 can be moved back from its blocking position (see FIG. 8B) to the release position (see FIG. 7B). The plug 200 can then be pulled out against the insertion direction 40. In the process, a front end of the recess 220 comes into contact with the second edge 139 of the locking section 136 and, as it is pulled out further, causes an upward movement of the lever 130 which therefore moves from its locking position (see FIG. 6) to its unlocking position (see FIG. 4). In the process, the first locking section 136 and the second locking section 220 disengage and the plug 200 can be completely released from the plug receptacle 100.

Once the plug 200 has been completely removed from the plug receptacle 100, the lever 130 is pushed back to its locking position on account of the prestressing force of the connecting conductor 140 (see FIG. 3). A plug 200 can then be releasably re-inserted into the plug receptacle 100.

In some embodiments, as an alternative to rotational locking by means of the lever 130 as illustrated in the drawings, translatory locking can also be provided in such a way that, instead of the lever 130 and the shaft 120, a locking element (not shown) which is arranged in a linearly movable manner in the housing 110 can be provided, said locking element moving upward in a linear manner (and substantially orthogonally in relation to the plug conductor 202, 204) when the plug 200 is pushed in (similar to the upward movement of the lever 130 in FIG. 4) and engaging in the recess 220 as part of the latching-in operation. Therefore, in a refinement of this kind, the locking section 136 can be identical to the refinement illustrated in the drawings with rotational locking by means of lever 130 and shaft 120.

What is claimed is:

1. A plug receptacle for an electrical plug-in connection, the plug receptacle comprising:
    a housing with an insertion region into which a plug can be releasably inserted;
    an electrical plug receptacle conductor rigidly arranged in the housing; and
    an electrical connecting conductor floating in the housing configured to electrically connect the plug receptacle, conductor to a plug conductor, wherein the floating electrical connecting conductor is not fixedly connected to any other element of the electrical plug-in connection;
    wherein the electrical connecting conductor exerts a connecting force onto a contact region of the plug conductor once inserted into the plug receptacle; and
    the connecting, force runs substantially orthogonally in relation to said contact region.

2. The plug receptacle as claimed in claim 1, further comprising a locking element to move linearly within the housing;
    wherein the locking element interacts with the connecting conductor and moves along a linear movement path between a locking position, wherein the plug is held in connection to the plug receptacle, and an unlocking position wherein the plug is not held in connection to the plug receptacle.

3. The plug receptacle as claimed in claim 2, wherein the linear movement path of the locking element runs substantially orthogonally in relation to the plug conductor.

4. The plug receptacle as claimed in claim 1, further comprising:
    a shaft arranged to rotate within the housing; and
    a lever is rigidly connected to the shaft, wherein the lever interacts with the connecting conductor and can be moved between a locking position, in which the plug can be fixedly connected to the plug receptacle, and an unlocking position in which the plug can be released from the plug receptacle.

5. The plug receptacle as claimed in claim 1, wherein the electrical connecting conductor comprises an electrically conductive helical spring.

6. The plug receptacle as claimed in claim 5, further comprising a lever with a passage opening through which the electrical connecting conductor at least partially extends and a stop face at least partially surrounding one end of the passage opening;
    wherein the helical spring includes a first region with a first diameter and a second region with a second diameter smaller than the first diameter; and
    one end of the first region adjacent the second region makes contact with the stop face when the lever is in the locking position.

7. The plug receptacle as claimed in claim 4, wherein the lever includes a first locking section to engage with a second locking section of the plug when the plug is inserted and the lever is in the locking position.

8. The plug receptacle as claimed in claim 7, wherein:
    the first locking section comprises a projection from the lever; and
    the second locking section comprises a recess in the plug into which the projection can at least partially project when the plug is inserted and the lever is in the locking position.

9. The plug receptacle as claimed in claim 1, wherein:
    the housing comprises a first housing element and a second housing element arranged to move relative to the first housing element between a release position and a blocking position;
    the first housing element includes the insertion region; and
    the second housing element, when in the blocking position, prevents release of the plug from the plug receptacle, and allows, when in the release position, release of the plug.

10. A plug-in connection comprising: a plug receptacle comprising:
    a housing with an insertion region into which a plug can be releasably inserted;
    an electrical plug receptacle conductor rigidly arranged in the housing;
    a first locking section; and
    an electrical connecting conductor floating in the housing configured to electrically connect a plug receptacle conductor to the plug conductor, wherein the floating electrical connecting conductor is not fixedly connected to any other element of the electrical plug-in connection;
    wherein the electrical connecting conductor exerts a connecting force onto a contact region of the plug conductor once inserted into the plug receptacle; and
    the connecting force runs substantially orthogonally in relation to said contact region; and the plug comprising:
    a substantially plate-like body movable between an unplugged position, in which the plate-like body is detached from the plug receptacle, and an inserted position, in which the plate-like body is inserted into the plug receptacle and electrically connected to the plug receptacle conductor;
    an electrical plug conductor attached to a surface of the plate-like body and comprising a contact region; and
    a second locking section on the plate-like body to engage with the first locking section when the plate-like body is in the inserted position;

wherein the plug can be releasably connected to the plug receptacle.

\* \* \* \* \*